(12) United States Patent
Abernathy et al.

(10) Patent No.: US 10,527,896 B2
(45) Date of Patent: Jan. 7, 2020

(54) CHIP ON GLASS PROTECTION

(71) Applicant: L3 Technologies, Inc., New York, NY (US)

(72) Inventors: Michael G. Abernathy, Ellijay, GA (US); Mark W. Fletcher, Hiawassee, GA (US); Sanjay Tripathi, Cumming, GA (US)

(73) Assignee: L3 TECHNOLOGIES, INC., New York, NY (US)

( * ) Notice: Subject to any disclaimer, the term of this patent is extended or adjusted under 35 U.S.C. 154(b) by 0 days.

(21) Appl. No.: 15/836,106

(22) Filed: Dec. 8, 2017

(65) Prior Publication Data

US 2019/0179187 A1    Jun. 13, 2019

(51) Int. Cl.
*G02F 1/1362* (2006.01)
*H01L 23/552* (2006.01)
(Continued)

(52) U.S. Cl.
CPC ...... *G02F 1/1362* (2013.01); *G02F 1/133345* (2013.01); *H01L 23/552* (2013.01);
(Continued)

(58) Field of Classification Search
CPC ............. G02F 1/1362; G02F 1/133345; G02F 1/133305; G02F 2001/133334;
(Continued)

(56) References Cited

U.S. PATENT DOCUMENTS 9,831,195 B1 * 11/2017 Lu ........................ H01L 23/562
2004/0014317 A1 * 1/2004 Sakamoto ............. H01L 21/568
438/689

(Continued)

FOREIGN PATENT DOCUMENTS

JP          3322556        9/2002

OTHER PUBLICATIONS

Notification of Transmittal of the International Search Report and the Written Opinion of the International Searching Authority, of the Declaration issued by the European Patent Office dated Mar. 27, 2019 on related international patent application PCT/US2018/064218.

*Primary Examiner* — Hoan C Nguyen
(74) *Attorney, Agent, or Firm* — Dickinson Wright PLLC (57) ABSTRACT

Various circuits may benefit from suitable protection. For example, certain displays, such as active matrix liquid crystal displays, may benefit from enclosures configured to protect driver circuits from high intensity radiated fields. A system can include a first protective conductive coating layer. The system can also include a first insulating layer on the first protective conductive layer. The system can further include a signal conductive layer on the insulating layer. The system can additionally include a driver layer mounted to the signal conductive layer. The system can also include a second insulating layer above the driver layer. The system can further include a second protective conductive coating layer on the second insulating layer. The system can additionally include one or a plurality of conductive elements disposed between the first protective conductive coating layer and the second protective conductive coating layer to form an enclosure around the driver layer.

20 Claims, 7 Drawing Sheets

(51) Int. Cl.
*H01L 27/12* (2006.01)
*G02F 1/1333* (2006.01)
*H01L 27/32* (2006.01)

(52) U.S. Cl.
CPC .... *H01L 27/1214* (2013.01); *G02F 1/133305* (2013.01); *G02F 2001/133334* (2013.01); *G02F 2001/136222* (2013.01); *G02F 2201/50* (2013.01); *H01L 27/3244* (2013.01)

(58) Field of Classification Search
CPC ..... G02F 2001/136222; G02F 2201/50; H01L 23/552; H01L 27/1214; H01L 27/3244
See application file for complete search history.

(56) References Cited

U.S. PATENT DOCUMENTS

| | | | |
|---|---|---|---|
| 2004/0046909 A1* | 3/2004 | Sekiguchi | G02F 1/1345 349/113 |
| 2012/0262898 A1 | 10/2012 | Yamada | |
| 2015/0130046 A1* | 5/2015 | Lin | H01L 24/97 257/712 |
| 2016/0079207 A1* | 3/2016 | Yamaguchi | H01L 25/065 257/738 |
| 2016/0104659 A1* | 4/2016 | Park | H01L 23/49838 257/774 |

* cited by examiner

Figure 7

CHIP ON GLASS PROTECTION

BACKGROUND

Field

Various circuits may benefit from suitable protection. For example, certain displays, such as active matrix liquid crystal displays, may benefit from enclosures configured to protect driver circuits from high intensity radiated fields.

Description of the Related Art

Active Matrix Liquid Crystal Display (AMLCD) can, in certain cases, be harmed by High Intensity Radiated Fields (HIRF). High Intensity Radiated Fields (HIRF) can be generated by multiple threats: Nuclear Electromagnetic Pulse (NEMP), directed energy weapons, and radars to name a few. Thus, today's display technologies are vulnerable to upset and/or damage due to these threats.

One of the most susceptible areas of today's displays is penetration through the front glass. Techniques such as Indium Tin Oxide (ITO) coating, screen mesh, micromesh, and the like may be used to shield the internal electronics from the threat by way of reflection. These techniques use a very thin external layer of ITO, wire mesh or micromesh because the thicker the material the more impact to the optical transmission performance, to thick and the display cannot be seen.

Even with the ITO, wire mesh or micro mesh technologies some of the energy penetrates the shield and enters the enclosure. The intensity of the electromagnetic fields inside the enclosure diminishes with distance from the internal glass surface.

Moreover, today's chip on glass (COG) technology is placing sensitive electronic chips adjacent to the ITO, wire mesh or micro mesh shield with only a glass thickness of separation.

As mentioned above, current technology relies on containment approaches external to the AMLCD for improvement to a unit's immunity by the use of Indium Titanium Oxide (ITO) coated cover-glass configurations. However, the HIRF threats are being enhanced to the point where ITO or other cover-glass coatings alone are not adequate for protection.

Figure 1:
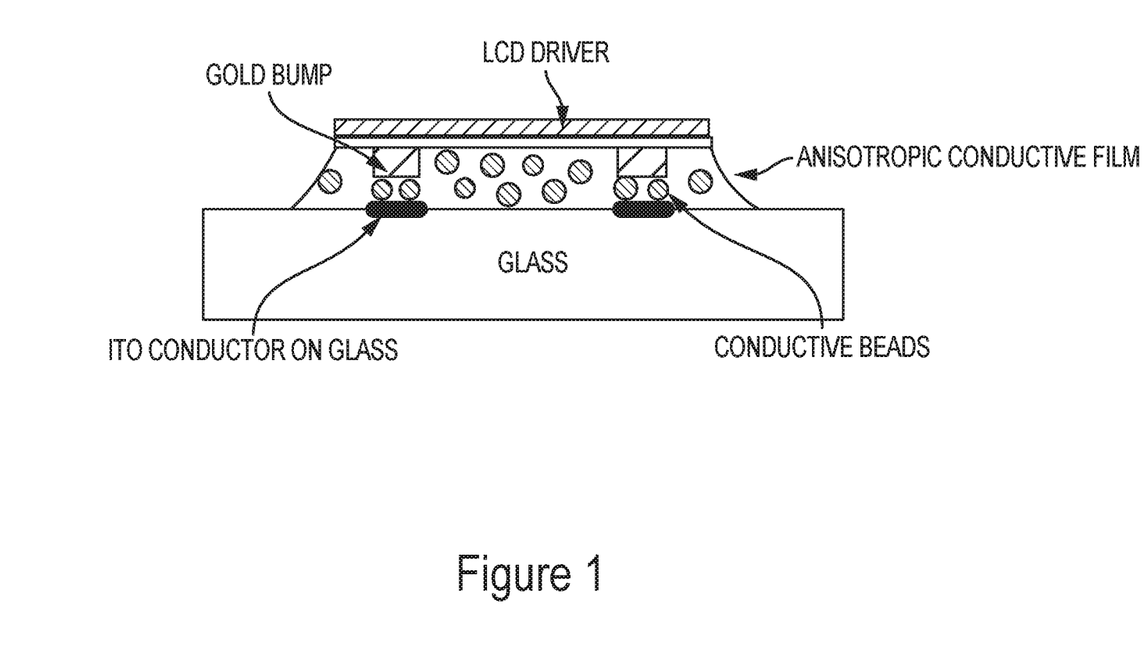
FIG. 1 illustrates chip on glass technology.

FIG. 1 illustrates chip on glass technology. COG technology uses a single internal layer of traces formed using ITO coating techniques to connect a flex cable at a glass edge to liquid crystal display (LCD) driver chip inputs. As shown in FIG. 1, these LCD drivers are bonded to the ITO conductors on glass using gold bumps and an anisotropic conductive film that is loaded with conductive beads. The driver outputs are also connected to the individual LCD cells via additional traces created using ITO coating techniques all on the same layer/surface of the glass from the chip outputs. However, current industry practice does not incorporate any protection on the AMLCD glass with respect to HIRF threats at this time.

SUMMARY

According to certain embodiments, a system can include a first protective conductive coating layer. The system can also include a first insulating layer on the first protective conductive layer. The system can further include a signal conductive layer on the insulating layer. The system can additionally include a driver layer mounted to the signal conductive layer. The system can also include a second insulating layer above the driver layer. The system can further include a second protective conductive coating layer on the second insulating layer. The system can additionally include one or a plurality of conductive elements disposed between the first protective conductive coating layer and the second protective conductive coating layer to form an enclosure around the driver layer.

In certain embodiments, a method can include providing a first protective conductive coating layer on a substrate. The method can also include providing a first insulating layer on the first protective conductive layer. The method can further include providing a signal conductive layer on the insulating layer. The method can additionally include providing a driver layer mounted to the signal conductive layer. The method can also include providing a second insulating layer above the driver layer. The method can further include providing a second protective conductive coating layer on the second insulating layer. The method can additionally include installing one or a plurality of conductive elements between the first protective conductive coating layer and the second protective conductive coating layer to form an enclosure around the driver layer.

BRIEF DESCRIPTION OF THE DRAWINGS

For proper understanding of the invention, reference should be made to the accompanying drawings, wherein.

DETAILED DESCRIPTION

Certain embodiments of the present invention relate to systems and methods for increasing the immunity of an Active Matrix Liquid Crystal Display (AMLCD) with respect to High Intensity Radiated Fields (HIRF). For example, certain embodiments of the present invention can incorporate an impedance controlled enclosure/structure on the glass to protect the chip-on-glass traces from external threat coupling.

More particularly, certain embodiments of the present invention include an integral multilayer stackup on the AMLCD glass. This stackup can be configured into a stripline or offset stripline cavity enclosing input traces to a chip-on-glass (COG). This cavity can provide additional shielding, minimize loop areas, and impedance control the input traces to the COG. The impedance control and stripline cavity approach can be extended through a flex cable to a digital interface board (DIB), thus protecting the chip-on-flex circuits as well.

Certain embodiments provide a new multi-layer approach that can create an internal enclosure on the internal surface of the glass. The approach can use ITO or some other metallization process that would allow an enclosure to be built. This enclosure can house the driver chips and still allow an ITO trace layer for inter-connecting the flex cable and LCD cells. This configuration may provide increased isolation of sensitive driver chips from external threat that may penetrate the external shield.

Figure 2:
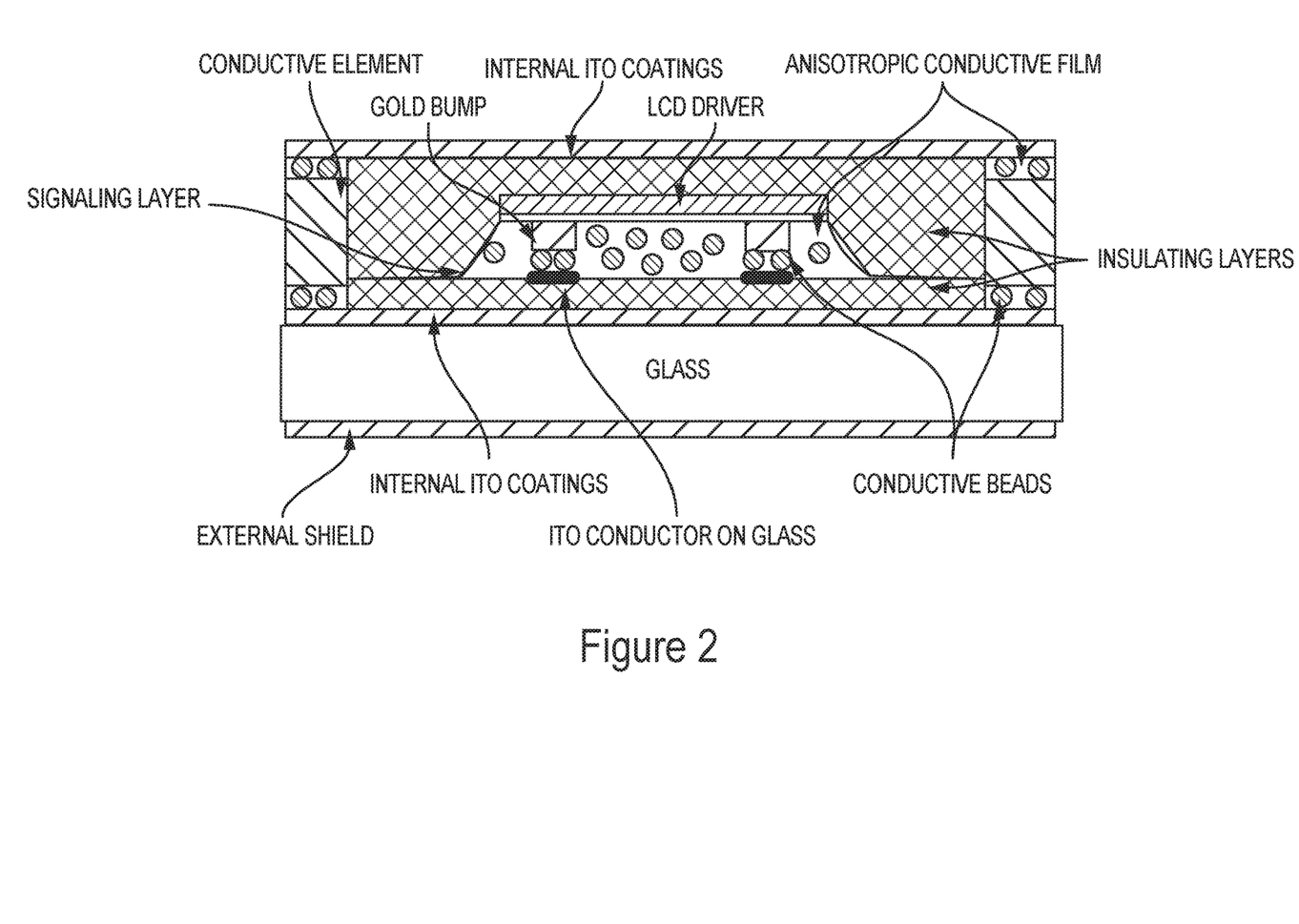
FIG. 2 illustrates an enclosure on glass, according to certain embodiments.

FIG. 2 illustrates an enclosure on glass, according to certain embodiments. As shown in FIG. 2, glass can be provided with an external shield on one side, illustrated here as the bottom side. On the other side of the glass, here illustrated as the top side, there can be an internal ITO coating. An insulating layer can be provided on top of the ITO coating. A signaling layer can be provided on the insulating layer. This signaling layer can include ITO conductor on glass leads. An LCD driver provided with gold bumps can be mounted to the ITO conductor on glass using, for example, anisotropic conductive film provided with conductive beads. Another insulating layer may be provided on top of the LCD driver. Around the insulating layers, the walls of an enclosure can be provided. These walls can be made from a conductive element mounted to the internal ITO coating using anisotropic conductive film impregnated with conductive beads. Moreover, anisotropic conductive film impregnated with conductive beads can be provided on top of the conductive element. A further internal ITO coating can be provided on the anisotropic conductive film and the insulating layer to complete the enclosure.

Not illustrated in FIG. 2, there can be pass-throughs in the conductive element, configured to permit signals from the signaling layer to pass through the wall of the enclosure. The pass through may provide an insulator around the signaling layer to prevent the signal layer from short-circuiting to the enclosure.

Figure 3:
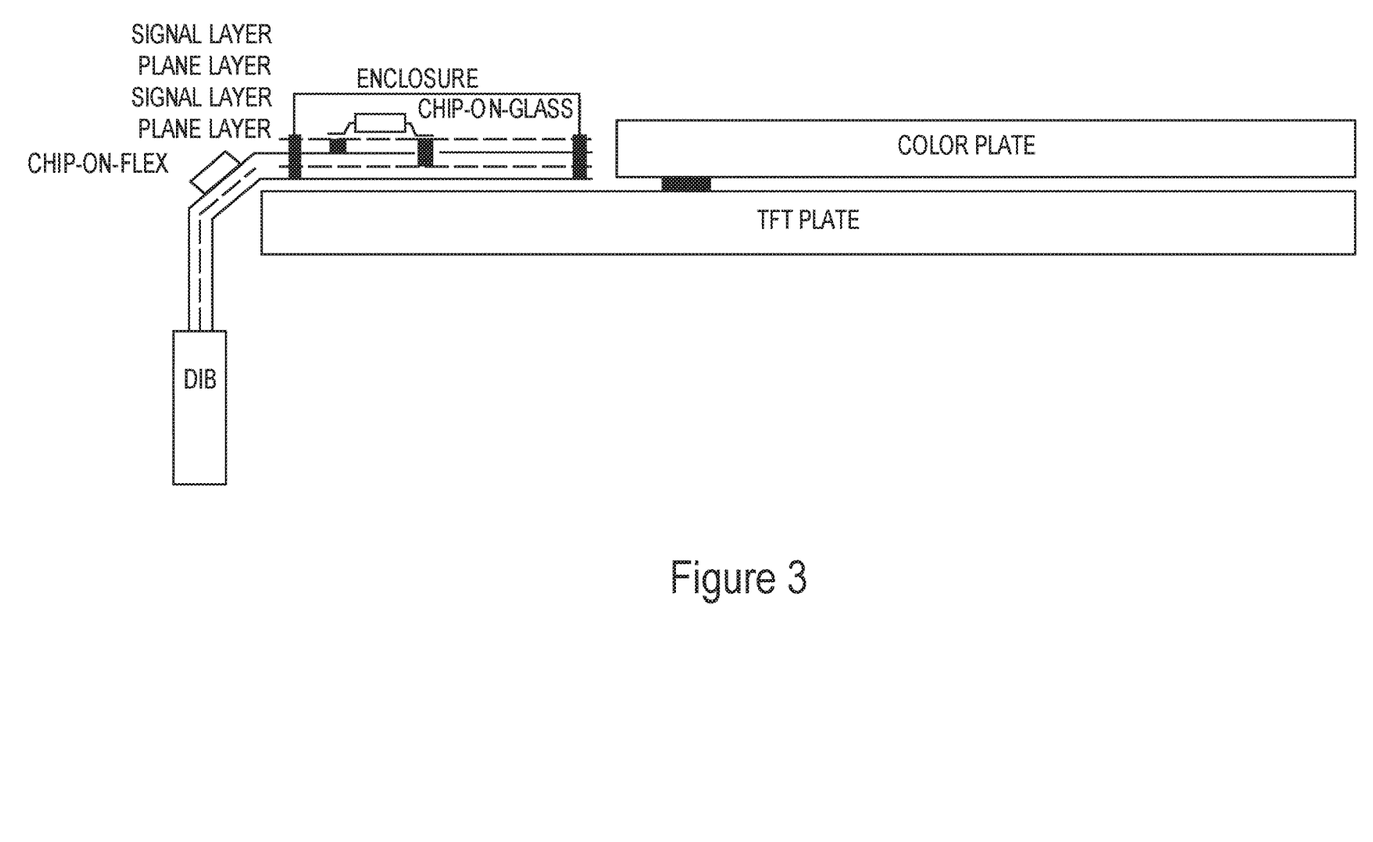
FIG. 3 illustrates a further example of an enclosure on glass, according to certain embodiments.

FIG. 3 illustrates a further example of an enclosure on glass, according to certain embodiments. As shown in FIG. 3, a chip on glass can be provided on the edge of a TFT plate, outside the viewable region, corresponding to the color plate. This example may be similarly constructed to the previous example, except that in this instance there may be a stack of signal layers and plane layers. The signal layers may feed out of the enclosure to a chip on flex, which in turn may connect to a DIB.

As can be seen from the above, a system can include a first protective conductive coating layer, such as an ITO layer. The first protective conductive layer can be disposed on a substrate, such as a glass plate. Glass is just an example material of the substrate. The substrate may, for example, include glass, plastic, sapphire, or any combination thereof.

The system can also include a first insulating layer on the first protective conductive layer. The insulating layer may be formed of any suitable insulating material.

The system can also include a signal conductive layer on the insulating layer. A driver layer can be mounted to the signal conductive layer. In certain embodiments, as shown in FIG. 3 for example, there can be multiple insulating layers and signal layers stacked.

The system can also include a second insulating layer above the driver layer. The system can further include a second protective conductive coating layer on the second insulating layer.

One or a plurality of conductive elements can be disposed between the first protective conductive coating layer and the second protective conductive coating layer to form an enclosure around the driver layer.

The one or the plurality of conductive elements can be connected to the first protective conductive coating layer by an anisotropic conductive film and similarly can also be connected to the second protective conductive coating layer by an anisotropic conductive film. The one or the plurality of conductive elements can be a ring, an array of linear elements, or an array of curved elements.

The system can further include apertures, such as the above-mentioned pass-throughs, in the one or the plurality of conductive elements. The apertures can be configured to permit signaling through the conductive elements.

The system can also include a further protective layer is provided on an opposite side of the substrate from the first protective conductive layer. This may be an external shield.

The enclosure can enclose a single driver formed by the driver layer, as illustrated in FIGS. 2 and 3. Alternatively, the enclosure can enclose a plurality of drivers formed by the driver layer.

The driver layer can include any desired driver circuit. For example, the driver layer can include a liquid crystal display driver, an organic electroluminescent display driver, a field emission display driver, or a surface-conduction electron-emitter display driver.

As shown in FIG. 3, the system can be installed adjacent to a color plate of a display. Other locations for the system are also permitted.

Figure 4:
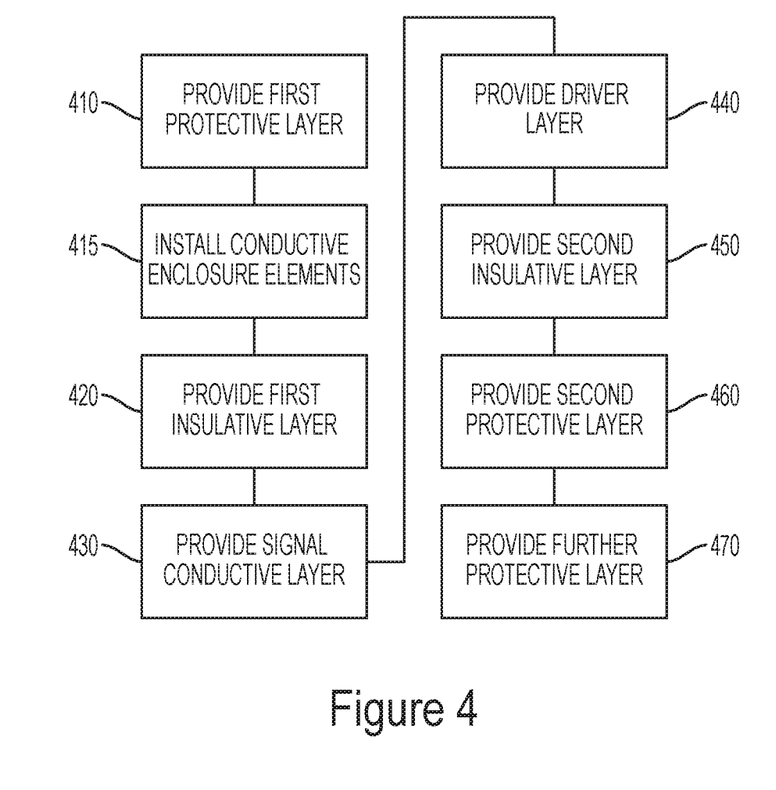
FIG. 4 illustrates a method according to certain embodiments.

FIG. 4 illustrates a method according to certain embodiments. As shown in FIG. 4, a method can include, at 410, providing a first protective conductive coating layer on a substrate. The method can also include, at 420, providing a first insulating layer on the first protective conductive layer. The method can further include, at 430, providing a signal conductive layer on the insulating layer. The steps at 420 and 430 can be repeated to provide a multilayer stack.

The method can also include, at 440, providing a driver layer mounted to the signal conductive layer. The method can further include, at 450, providing a second insulating layer above the driver layer. The method can additionally include, at 460, providing a second protective conductive coating layer on the second insulating layer. The method can also include, at 415, installing one or a plurality of conductive elements between the first protective conductive coating layer and the second protective conductive coating layer to form an enclosure around the driver layer. The method can further include, at 470, providing a further protective layer on an opposite side of the substrate from the first protective conductive layer.

The installing can include connecting the one or the plurality of conductive elements to the first protective conductive coating layer by an anisotropic conductive film. The installing can also include connecting the one or the plurality of conductive elements to the second protective conductive coating layer by an anisotropic conductive film.

Figure 5:
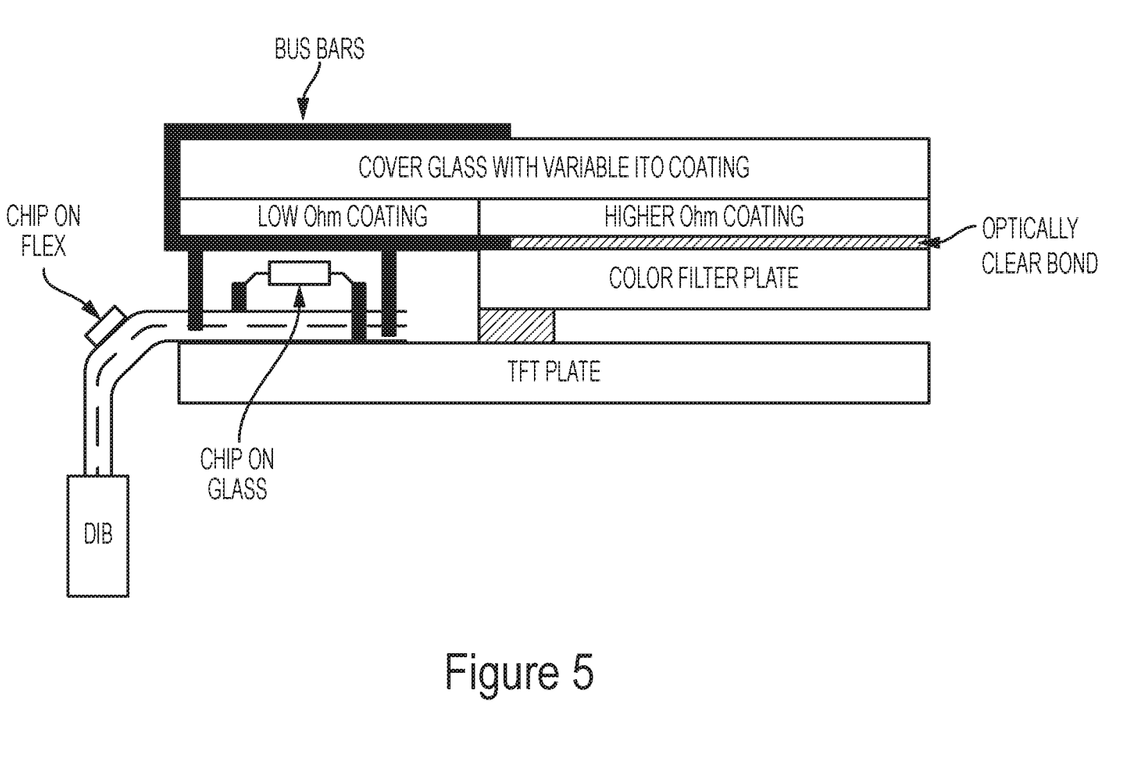
FIG. 5 illustrates another example of an enclosure on glass, according to certain embodiments.

FIG. 5 illustrates another example of an enclosure on glass, according to certain embodiments. The enclosure of FIG. 5 may be constructed similarly to the embodiment shown in FIG. 3, but with some differences. For example, the top of the enclosure may be formed from or may include bus bars. These bus bars may be located above and below a cover glass and ohmic coating. The ohmic coating may involve a low ohm coating in the section above the display driver and a higher ohm coating over the cover filter plate. The higher ohm coating may be bonded to the color filter plate with an optically clear bond. Thus, an electromagnetic interference (EMI) shielding glass with low ohm coating can be bonded on the AMLCD panel. Instead of a glass with uniform coating, a variable coating can be can be applied and extended over to create an enclosure as shown in FIG. 5.

Figure 6:
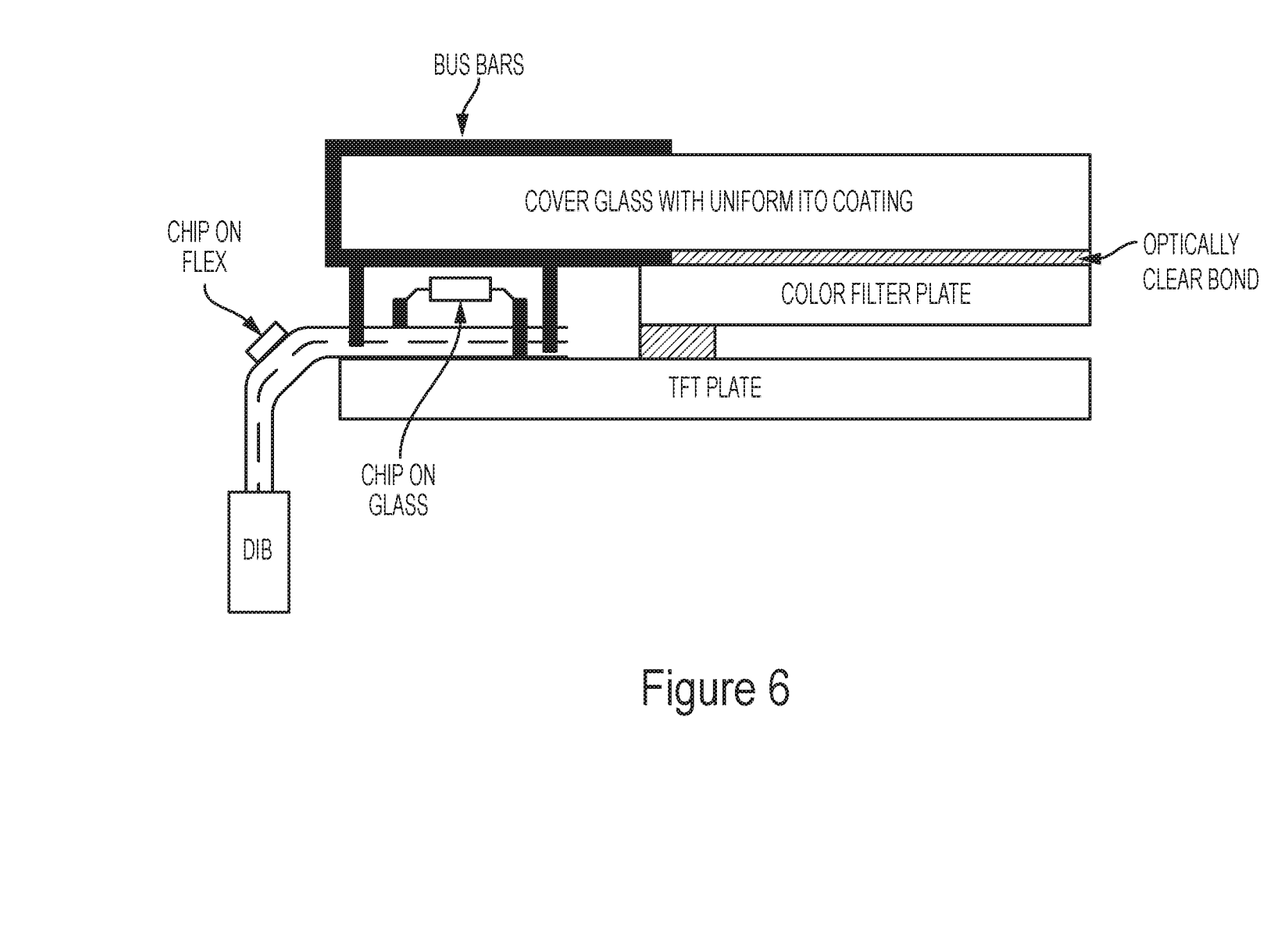
FIG. 6 illustrates an additional example of an enclosure on glass, according to certain embodiments.

FIG. 6 illustrates an additional example of an enclosure on glass, according to certain embodiments. As can be seen in FIG. 6, this example can differ from the example of FIG. 5 in that a cover glass with a uniform coating and a U-shaped bus-bar can be utilized for the top of the enclosure. The bus bar can include electrically conductive material and can extend all the way to the active area of the display.

Figure 7:
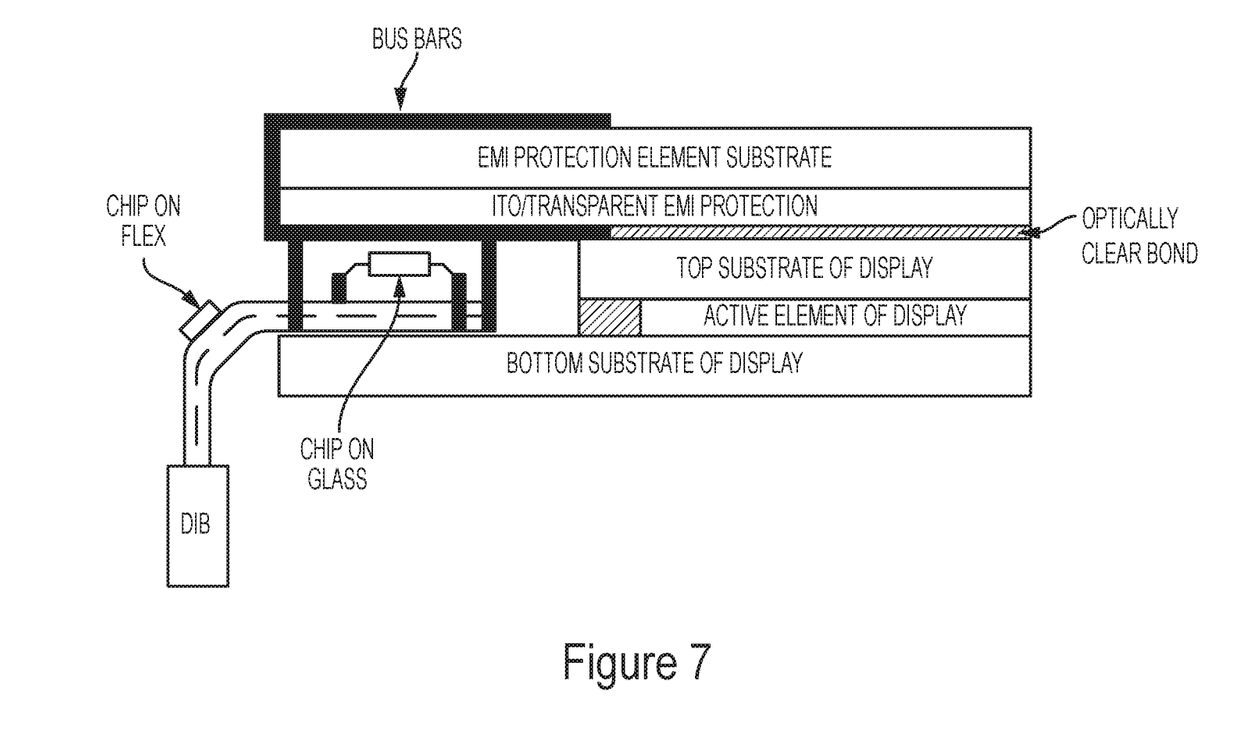
FIG. 7 illustrates yet another example of an enclosure on glass, according to certain embodiments.

FIG. 7 illustrates yet another example of an enclosure on glass, according to certain embodiments. In this case, the embodiment may differ from that of FIG. 6 in that an EMI protection element substrate may be provided as a top layer and the display may include both an active element and a top substrate. Thus, embodiments can include all types of displays, such as OLED, quantum dots LED (QLED), and so on, and a cover material that is not glass as shown in FIG. 7. The EMI protection can come from any source like ITO, carbon nanotube based material, printed or etched ITO lines, micro/nano mesh, graphene-based material, or the like.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. For example, the approach described herein may be compatible with chip on flex in combination with chip on glass technologies as well.

We claim:

1. A system comprising: at least one display driver mounted on a signal conductive layer, wherein the signal conductive layer is disposed on a first insulating layer; a second insulating layer is disposed on the at least on display driver; and a conductive enclosure substantially enclosing the at least on display driver; the signal conductive layer, the first insulating layer; and the second insulating layer therewithin; wherein the conductive enclosure comprises a first protective coating layer on which the first insulating layer is disposed; a second protective coating layer disposed on the second insulating layer; at least one conductive element disposed between the first protective coating layer and the second protective coating layer; wherein the conductive enclosure is entirely insulating from the at least one display driver and the signal conductive layer by at least the first insulating layer and the second insulating layer.

2. The system of claim 1, further comprising at least one aperture formed in the at least one conductive element, wherein the at least one aperture is configured to permit signaling therethrough.

3. The system of claim 1, wherein the first protective conductive layer is disposed on a substrate.

4. The system of claim 3, wherein the substrate comprises at least one of glass, plastic, or sapphire.

5. The system of claim 3, wherein a further protective layer is provided on an opposite side of the substrate from the first protective conductive layer.

6. The system of claim 1, wherein the first protective conductive layer comprises indium tin oxide.

7. The system of claim 1, wherein the at least one display driver comprises only a single display driver.

8. The system of claim 1, wherein the at least one display driver comprises a plurality of display drivers.

9. The system of claim 1, wherein the conductive enclosure further comprises an anisotropic conductive film connecting the at least one conductive element to the first protective coating layer.

10. The system of claim 1, wherein the conductive enclosure further comprises an anisotropic conductive film connecting the at least one conductive element to the second protective coating layer.

11. The system of claim 1, wherein the at least one display driver comprises at least one of a liquid crystal display driver, an organic electroluminescent display driver, a field emission display driver, and a surface-conduction electron-emitter display driver.

12. The system of claim 1, wherein the at least one conductive element comprises at least one of a ring, an array of linear elements, and an array of curved elements.

13. The system of claim 1, wherein the system is installed adjacent to a color plate of a display.

14. The system of claim 1, further comprising:
a third insulating layer disposed on the signal conductive layer; and
a second signal conductive layer disposed on the third insulating layer,
wherein the second signal conductive layer is connected to the at least one display driver.

15. A method, comprising:
providing a first protective conductive coating layer on a substrate;
providing a first insulating layer on the first protective conductive layer;
providing a signal conductive layer on the first insulating layer;
providing at least one display driver mounted on the signal conductive layer;
providing a second insulating layer above the driver layer;
providing a second protective conductive coating layer on the second insulating layer; and
installing at least one conductive element between the first protective conductive coating layer and the second protective conductive coating layer;
wherein the first protective conductive coating layer, the second protective conductive coating layer, and the at least one conductive element, together, form a conductive enclosure that substantially encloses the at least one display driver, the signal conductive layer, the first insulating layer, and the second insulating layer therewithin; and
wherein the conductive enclosure is entirely insulated from the at least one display driver and signal conductive layer by at least the first insulating layer and the second insulating layer.

16. The method of claim 15, wherein the substrate comprises at least one of glass, plastic, or sapphire.

17. The method of claim 15, further comprising:
providing a further protective layer on an opposite side of the substrate from the first protective conductive layer.

18. The method of claim 15, wherein the installing comprises connecting the at least one conductive element to the first protective conductive coating layer by an anisotropic conductive film.

19. The method of claim 15, wherein the installing comprises connecting the at least one conductive element to the second protective conductive coating layer by an anisotropic conductive film.

20. The method of claim 15, wherein the at least one display driver comprises at least one of a liquid crystal display driver, an organic electroluminescent display driver, a field emission display driver, and a surface-conduction electron-emitter display driver.

* * * * *